(12) United States Patent
Sato

(10) Patent No.: US 10,989,527 B2
(45) Date of Patent: Apr. 27, 2021

(54) POSITION DETECTION APPARATUS, POSITION DETECTION METHOD, IMPRINT APPARATUS, AND METHOD OF MANUFACTURING ARTICLE

(71) Applicant: CANON KABUSHIKI KAISHA, Tokyo (JP)

(72) Inventor: Hiroshi Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/427,406

(22) Filed: May 31, 2019

(65) Prior Publication Data

US 2019/0285403 A1    Sep. 19, 2019

Related U.S. Application Data

(62) Division of application No. 14/750,193, filed on Jun. 25, 2015, now Pat. No. 10,337,856.

(30) Foreign Application Priority Data

Jun. 27, 2014 (JP) ................ 2014-133245
Jun. 9, 2015 (JP) ................ 2015-116883

(51) Int. Cl.
*G01B 11/25* (2006.01)
*G03F 7/00* (2006.01)
*G03F 9/00* (2006.01)

(52) U.S. Cl.
CPC .......... *G01B 11/254* (2013.01); *G03F 7/0002* (2013.01); *G03F 9/7038* (2013.01); *G03F 9/7049* (2013.01)

(58) Field of Classification Search
None
See application file for complete search history.

(56) References Cited

U.S. PATENT DOCUMENTS 3,687,554 A * 8/1972 Iwahashi ............ G01J 3/2846
356/330
4,568,189 A * 2/1986 Bass ................. G03F 9/7023
356/150

(Continued)

FOREIGN PATENT DOCUMENTS

CN        1036236 A    10/1989
CN        2903975 Y     5/2007

(Continued)

OTHER PUBLICATIONS

Office Action issued in Chinese Appln. No. 201810126879.2 dated Jun. 23, 2020. English translation provided.

(Continued)

*Primary Examiner* — Shawn Decenzo
(74) *Attorney, Agent, or Firm* — Rossi, Kimms & McDowell LLP

(57) ABSTRACT

The present invention provides a position detection apparatus including a detection unit configured to detect moire caused by overlap between a first diffraction grating including patterns arrayed in a first direction and a second diffraction grating including patterns arrayed in the first direction, and a processing unit configured to obtain a relative position of the first diffraction grating and the second diffraction grating based on the moire, wherein a width of an end pattern of patterns included in at least one of the first diffraction grating and the second diffraction grating in the first direction is smaller than widths of remaining patterns of the at least one diffraction grating in the first direction.

34 Claims, 11 Drawing Sheets

(56) References Cited

U.S. PATENT DOCUMENTS

| | | | |
|---|---|---|---|
| 4,988,865 A | | 1/1991 | Schmidt |
| 5,719,676 A * | | 2/1998 | Kulawiec ............ G01B 11/2441 |
| | | | 356/512 |
| 5,971,546 A * | | 10/1999 | Park ..................... H04N 9/3188 |
| | | | 345/56 |
| 6,509,559 B1 | | 1/2003 | Ulrich |
| 6,590,605 B1 * | | 7/2003 | Eichenlaub ............ H04N 13/31 |
| | | | 348/51 |
| 7,292,326 B2 | | 11/2007 | Nimmakayala et al. |
| 7,349,105 B2 * | | 3/2008 | Weiss ................. G03F 7/70633 |
| | | | 356/401 |
| 7,608,813 B1 * | | 10/2009 | Milvich ............. G01D 5/34784 |
| | | | 250/231.13 |
| 7,710,578 B2 | | 5/2010 | Sandig |
| 7,863,763 B2 * | | 1/2011 | Van Haren ............ G03F 9/7076 |
| | | | 257/797 |
| 7,880,880 B2 * | | 2/2011 | Van Bilsen ........... G03F 9/7049 |
| | | | 356/399 |
| 8,593,646 B2 | | 11/2013 | Den Boef |
| 8,842,294 B2 | | 9/2014 | Minoda et al. |
| 8,922,786 B2 | | 12/2014 | Iwai et al. |
| 9,122,149 B2 | | 9/2015 | Sato et al. |
| 9,752,901 B2 * | | 9/2017 | Kato .................. G01D 5/34715 |
| 2004/0032659 A1 * | | 2/2004 | Drinkwater .......... G02B 6/0051 |
| | | | 359/558 |
| 2004/0179184 A1 * | | 9/2004 | Levasier ............... G03F 9/7003 |
| | | | 355/75 |
| 2004/0246482 A1 * | | 12/2004 | Sezginer ............ G01N 21/4788 |
| | | | 356/401 |
| 2005/0146699 A1 * | | 7/2005 | Levasier ............... G03F 9/7003 |
| | | | 355/53 |
| 2007/0125939 A1 * | | 6/2007 | Yaku .................. G01D 5/34746 |
| | | | 250/231.16 |
| 2008/0094629 A1 * | | 4/2008 | Wu ....................... G03F 9/7003 |
| | | | 356/401 |
| 2012/0244319 A1 * | | 9/2012 | Wuister ................. G03F 7/0002 |
| | | | 428/156 |
| 2012/0292493 A1 * | | 11/2012 | Hermann ................. G01D 5/38 |
| | | | 250/231.1 |
| 2012/0328725 A1 * | | 12/2012 | Minoda .................. B82Y 10/00 |
| | | | 425/150 |
| 2013/0077100 A1 * | | 3/2013 | Fukui ................... G01B 9/0209 |
| | | | 356/511 |
| 2013/0100459 A1 * | | 4/2013 | Iwai ........................ G01D 5/38 |
| | | | 356/499 |
| 2013/0120614 A1 * | | 5/2013 | Oyama ..................... G06T 5/10 |
| | | | 348/234 |
| 2013/0161500 A1 * | | 6/2013 | Xie ........................... F21V 5/04 |
| | | | 250/231.1 |
| 2013/0163004 A1 | | 6/2013 | Matsumoto |
| 2014/0263987 A1 * | | 9/2014 | Tobiason ........... G01D 5/34715 |
| | | | 250/231.1 |
| 2014/0346694 A1 * | | 11/2014 | Minoda .................... G02B 5/18 |
| | | | 264/1.36 |
| 2015/0377614 A1 | | 12/2015 | Sato |
| 2016/0153812 A1 * | | 6/2016 | Kato ...................... G01D 5/366 |
| | | | 250/231.1 |
| 2016/0291543 A1 * | | 10/2016 | Saito .................... G03H 1/0486 |
| 2017/0227384 A1 * | | 8/2017 | Kato .................. G01D 5/34784 |
| 2017/0261351 A1 * | | 9/2017 | Nagura .............. G01D 5/34707 |
| 2017/0329217 A1 * | | 11/2017 | Minoda ................. G03F 7/0002 |

FOREIGN PATENT DOCUMENTS

| | | |
|---|---|---|
| CN | 101144730 A | 3/2008 |
| CN | 101246228 A | 8/2008 |
| CN | 101424513 A | 5/2009 |
| CN | 102155914 A | 8/2011 |
| CN | 102200687 A | 9/2011 |
| CN | 102645847 A | 8/2012 |
| CN | 103105127 A | 5/2013 |
| CN | 103175468 A | 6/2013 |
| CN | 103411540 A | 11/2013 |
| JP | S4986980 A | 8/1974 |
| JP | H07084110 A | 3/1995 |
| JP | 2002543375 A | 12/2002 |
| JP | 2007142419 A | 6/2007 |
| JP | 2013030757 A | 2/2013 |
| JP | 2013131607 A | 7/2013 |
| JP | 2013254780 A | 12/2013 |
| JP | 6341883 B2 | 6/2018 |
| KR | 1020120140622 A | 12/2012 |
| WO | 2014004669 A1 | 1/2014 |

OTHER PUBLICATIONS

Office Action issued in Chinese Appln. No. 201810126879.2 dated Jul. 31, 2019. English translation provided.

Office Action issued in Chinese Appln. No. 201810939318A dated Feb. 26, 2020. English translation provided.

Office Action issued in Korean Appln. No. 10-2015-0091007 dated Oct. 18, 2016.

Office Action issued in Chinese Appln. No. 201510369385.3 dated Aug. 2, 2017. English translation provided.

Office Action issued in Korean Appln. No. 10-2017-0148768 dated Feb. 5, 2018.

Office Action issued in Japanese Appln. No. 2018-094728 dated Mar. 12, 2019.

Office Action issued in U.S. Appl. No. 14/750,193 dated Sep. 26, 2017.

Office Action issued in U.S. Appl. No. 14/750,193 dated Apr. 25, 2018.

Notice of Allowance issued in U.S. Appl. No. 14/750,193 dated Nov. 20, 2018.

Notice of Allowance issued in U.S. Appl. No. 14/750,193 dated Mar. 15, 2019.

Office Action issued in Chinese Appln. No. 201810126879.2 dated Dec. 14, 2020. English translation provided.

* cited by examiner

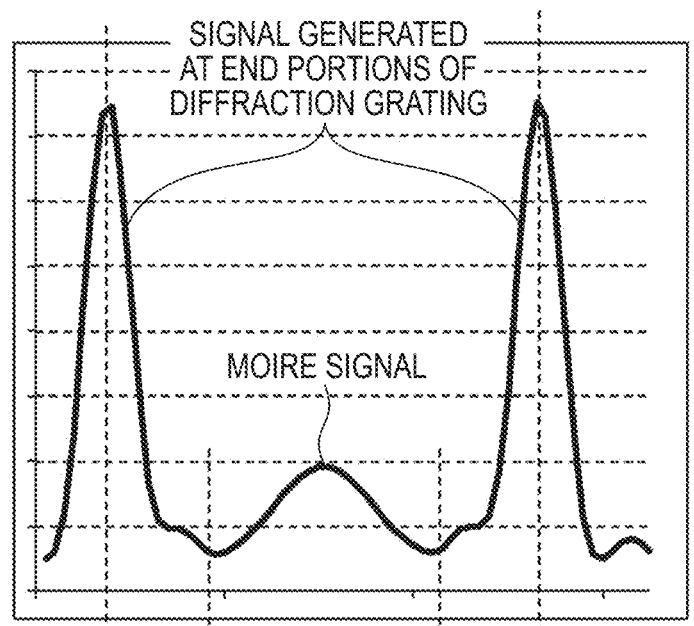
F I G. 15A
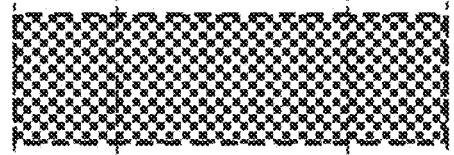
F I G. 15B
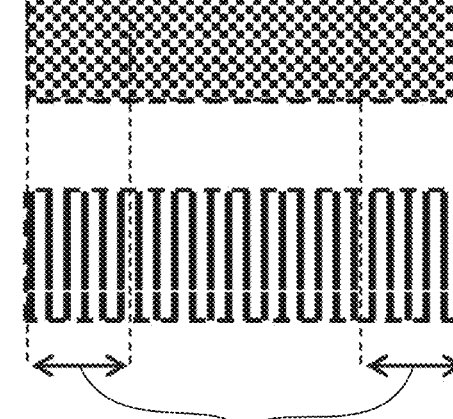
F I G. 15C

POSITION DETECTION APPARATUS, POSITION DETECTION METHOD, IMPRINT APPARATUS, AND METHOD OF MANUFACTURING ARTICLE

BACKGROUND OF THE INVENTION

Field of the Invention

The present invention relates to a position detection apparatus, a position detection method, an imprint apparatus, and a method of manufacturing an article.

Description of the Related Art

An imprint technique is a technique capable of forming nano-scale fine patterns, and is proposed as one of the mass-production nanolithography techniques for semiconductor devices and magnetic storage media. An imprint apparatus using an imprint technique cures a resin (imprint material) on a substrate while a mold on which patterns are formed is in contact with the resin and then separates the mold from the cured resin, thereby forming the patterns on the substrate. The imprint apparatus generally uses, as a resin curing method, a photo-curing method of curing a resin on a substrate by irradiating the resin with light such as ultraviolet light.

The imprint apparatus needs to accurately align a mold with a substrate when contacting the mold with a resin on the substrate. For example, as an alignment scheme for a mold and a substrate, a die-by-die alignment scheme is used. The die-by-die alignment scheme is a scheme of performing alignment by detecting a mark formed on each shot region on a substrate and a corresponding mark on a mold. Such techniques associated with the alignment between a mold and a substrate has been proposed in U.S. Pat. No. 7,292,326 and Japanese Patent Laid-Open No. 2013-030757.

The specification of U.S. Pat. No. 7,292,326 has proposed an imprint apparatus including a mark detection mechanism for detecting marks used for the alignment between a mold and a substrate. According to the specification of U.S. Pat. No. 7,292,326, a mold and a substrate are respectively provided with diffraction gratings as marks used for the alignment between the mold and the substrate. A diffraction grating on the mold side is a one that has a period in the measurement direction. A diffraction grating on the substrate side is a one with a checkerboard pattern that has periods in both the measurement direction and a direction (non-measurement direction) perpendicular to the measurement direction. The mark detection mechanism detects the moire caused by the overlap between a diffraction grating on the substrate side and a diffraction grating on the mold side. The mark detection mechanism includes an illumination optical system which illuminates diffraction gratings and a detection optical system which detects diffracted light from the diffraction gratings. Both the systems are arranged at tilts from a direction perpendicular to a mold and a substrate to non-measurement directions. In other words, the illumination optical system is configured to perform oblique incident illumination on a diffraction grating from a non-measurement direction. Light obliquely entering a diffraction grating on the substrate side is diffracted in a non-measurement direction by the diffraction grating, and is detected by the detection optical system. The detection optical system is arranged in a non-measurement direction to detect only a single diffracted light beam other than 0th-order light. In addition, Japanese Patent Laid-Open No. 2013-030757 has proposed a technique of forming a plurality of poles in the pupil plane of the illumination optical system and measuring the relative positions between a mold and a substrate in a plurality of directions.

According to the related art, however, strong diffracted light or scattered light is generated from ends of a diffraction grating on the mold side and of a diffraction grating on the substrate side (two ends of the patterns of each diffraction grating), and their influences are reflected in the detection signals obtained by the mark detection mechanism, resulting in the occurrence of "deception" (errors). As a result, the alignment accuracy (overlap accuracy) between molds and substrates deteriorates, leading to pattern transfer failures (product failures).

SUMMARY OF THE INVENTION

The present invention provides a technique advantageous in detecting the relative positions of two diffraction gratings which cause moire.

According to one aspect of the present invention, there is provided a position detection apparatus including a detection unit configured to detect moire caused by overlap between a first diffraction grating including patterns arrayed in a first direction and a second diffraction grating including patterns arrayed in the first direction, and a processing unit configured to obtain a relative position of the first diffraction grating and the second diffraction grating based on the moire, wherein a width of an end pattern of patterns included in at least one of the first diffraction grating and the second diffraction grating in the first direction is smaller than widths of remaining patterns of the at least one diffraction grating in the first direction.

Further aspects of the present invention will become apparent from the following description of exemplary embodiments with reference to the attached drawings.

BRIEF DESCRIPTION OF THE DRAWINGS

FIGS. 15A to 15C are views showing a relationship between moire signal and a diffraction grating.

DESCRIPTION OF THE EMBODIMENTS

Figure 1A:
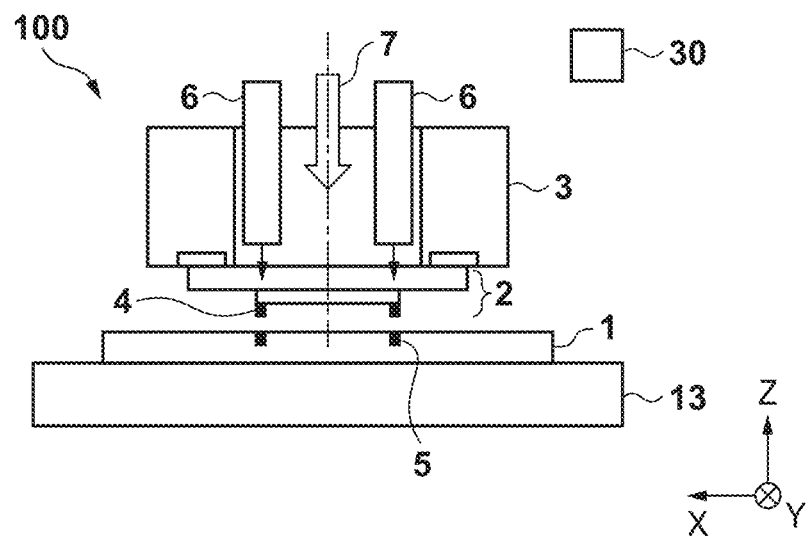
FIGS. 1A and 1B are schematic views showing the arrangement of an imprint apparatus according to one aspect of the present invention.

Preferred embodiments of the present invention will be described below with reference to the accompanying drawings. Note that the same reference numerals denote the same members throughout the drawings, and a repetitive description thereof will not be given.

First Embodiment

Figure 1B:
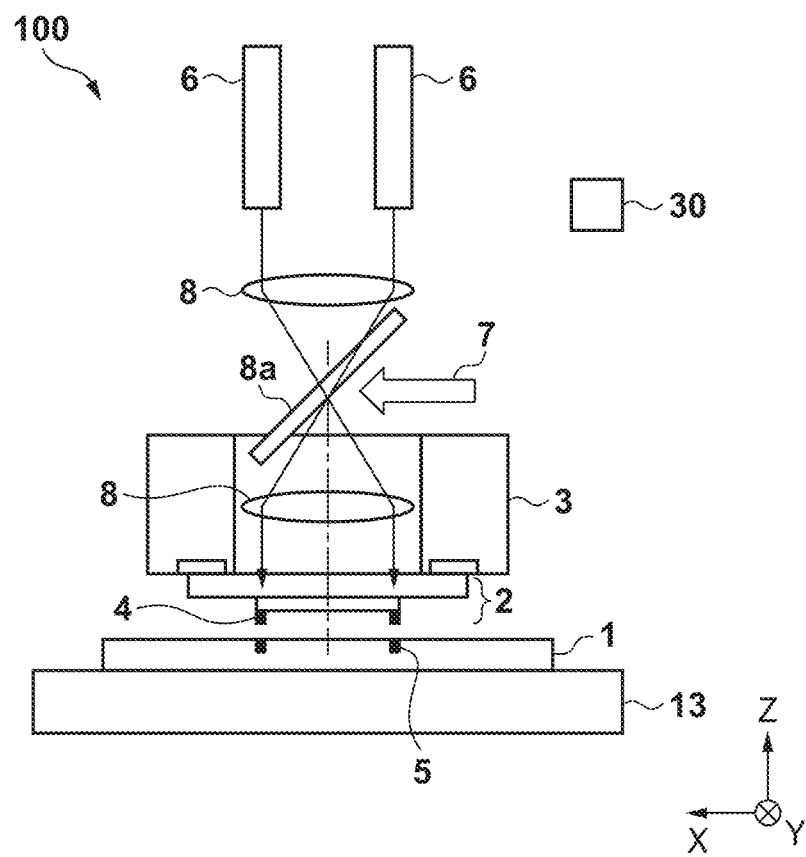

FIGS. 1A and 1B are schematic views showing the arrangement of an imprint apparatus 100 as an aspect of the present invention. The imprint apparatus 100 performs the imprint processing of molding an imprint material on a substrate and forming patterns on the substrate. This embodiment uses a resin as an imprint material and a photo-curing method of curing a resin by irradiating it with ultraviolet light as a resin curing method.

The imprint apparatus 100 includes an imprint head 3, position detection apparatuses 6, a substrate stage 13, and a control unit 30. The imprint apparatus 100 also includes a resin supply unit including a dispenser for supplying (applying) a resin on a substrate, a bridge surface plate for holding the imprint head 3, and a base surface plate for holding the substrate stage 13.

The imprint apparatus 100 applies a resin on a substrate 1 held on the substrate stage 13 and brings a mold 2 (its pattern surface) on which predetermined patterns are formed into contact with the resin. The imprint apparatus 100 then cures the resin on the substrate by irradiating it with ultraviolet light 7 while the mold 2 is contact with the resin, and separates (releases) the mold 2 from the cured resin, thereby forming patterns on the resin on the substrate.

The mold 2 is held by the imprint head 3 as a support member. As shown in FIG. 1A, each position detection apparatus 6 is arranged in the imprint head 3. The position detection apparatus 6 detects the relative positions of a mark 4 provided with the mold 2 and a mark 5 provided with the substrate 1 by optically observing the marks. If, however, it is difficult to arrange each position detection apparatus 6 in (the space of) the imprint head 3, an image forming optical system 8 may be used to form light from the mark 4 and the mark 5 into images on the upper side and observe the images, as shown in FIG. 1B.

In this embodiment, when performing imprint processing, the ultraviolet light 7 for curing a resin on a substrate is emitted from above. When, therefore, using the image forming optical system 8, a composite prism 8a may be arranged in the image forming optical system 8 to combine the optical path of light from each position detection apparatus 6 and the optical path of the ultraviolet light 7, as shown in FIG. 1B. In this case, the composite prism 8a has the property of reflecting the ultraviolet light 7 and transmitting light from the position detection apparatus 6. Note that the relationship between the position detection apparatus 6 and the ultraviolet light 7 may be reversed, and the composite prism 8a may have the property of transmitting the ultraviolet light 7 and reflecting light from the position detection apparatus 6.

The control unit 30 includes a CPU and a memory, and controls the overall imprint apparatus 100 (the respective units of the imprint apparatus 100). The control unit 30 controls imprint processing and processing associated with it. For example, when performing imprint processing, the control unit 30 aligns the mold 2 and the substrate 1 by moving the imprint head 3 and the substrate stage 13 in the x and y directions based on the detection results obtained by the position detection devices 6.

Figure 2:
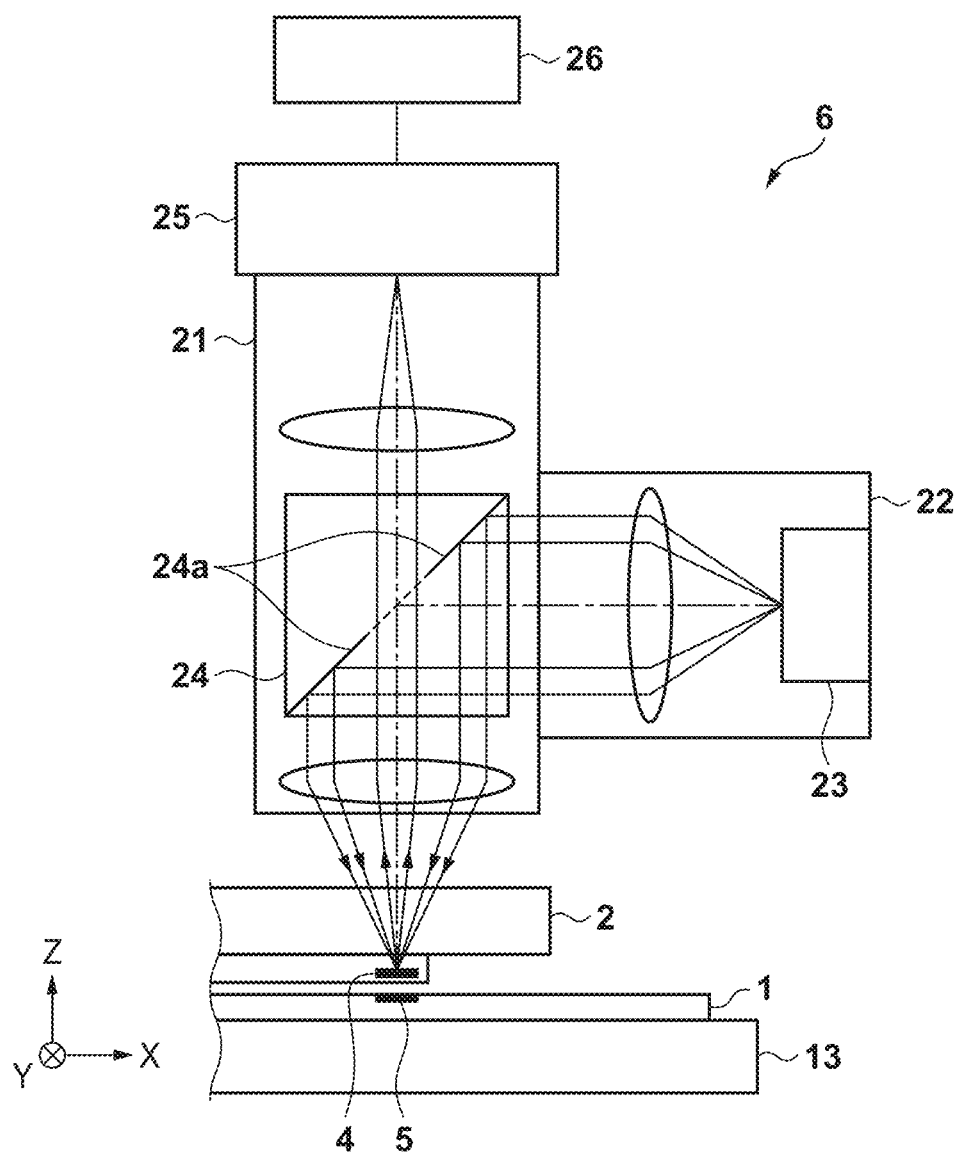
FIG. 2 is a schematic view showing an example of the arrangement of each position detection apparatus for the imprint apparatus shown in FIGS. 1A and 1B.

Each position detection apparatus 6 and the marks 4 and 5 respectively provided with the mold 2 and the substrate 1 will be described in detail below. FIG. 2 is a schematic view showing an example of the arrangement of each position detection apparatus 6. The position detection apparatus 6 includes a detection optical system 21 and an illumination optical system 22. FIG. 2 shows that the detection optical system 21 (its optical axis) and the illumination optical system 22 (its optical axis) share a portion.

The illumination optical system 22 guides light from a light source 23 onto the same optical axis as that of the detection optical system 21 by using optical members such as a prism 24 to illuminate the marks 4 and 5. As the light source 23, for example, a halogen lamp or LED is used. The light source 23 emits light having a wavelength different from that of the ultraviolet light 7. In this embodiment, since the ultraviolet light 7 is used as light for curing a resin, the light source 23 emits visible light or infrared light.

As described above, the detection optical system 21 and the illumination optical system 22 are configured to share some of the optical members constituting them. The prism 24 is arranged on or near the pupil planes of the detection optical system 21 and the illumination optical system 22. The marks 4 and 5 each are formed from a diffraction grating including patterns arrayed in the first direction (X or Y direction). The detection optical system 21 forms light diffracted by the marks 4 and 5 illuminated by the illumination optical system 22 into images on an image sensor 25. Light from the marks 4 and 5 is formed into images as moire (moire fringes) on the image sensor 25. As the image sensor 25, a CCD sensor, a CMOS sensor, or the like is used. As described above, the detection optical system 21 functions as a detection unit which detects the moire caused by the overlap between the mark 4 and the mark 5. A processing unit 26 obtains the relative positions of the mark 4 and the mark 5 based on the moire detected by the image sensor 25. Note however that the control unit 30 may have the function of the processing unit 26 (that is, the processing unit 26 and the control unit 30 may be integrated).

The prism 24 has, on its bonding surface, a reflecting film 24a for reflecting light at a peripheral portion of the pupil plane of the illumination optical system 22. The reflecting film 24a functions as an aperture stop which defines the shape of the pupil intensity distribution of the illumination optical system 22. The reflecting film 24a also functions as an aperture stop which defines the size of the pupil of the detection optical system 21 (a numeral aperture $NA_o$ of the detection optical system 21).

The prism 24 may be a half prism having a translucent film on the bonding surface or may be replaced by a plate-like optical element having a reflecting film on the surface. Alternatively, in order to change the pupil shapes of the illumination optical system 22 and the detection optical system 21, the prism 24 may be configured to be replaced by another prism by using a switching mechanism such as a turret or slide mechanism. In addition, the prism 24 need not be positioned on or near the pupil planes of the detection optical system 21 and the illumination optical system 22.

In this embodiment, the pupil shape of the illumination optical system 22 is defined by the reflecting film 24a of the prism 24. However, this is not exhaustive. For example, the same effect can be obtained by arranging, at the pupil position of the illumination optical system 22, a mechanical stop, a stop obtained by drawing graphics on a glass surface, or the like.

Figure 3:
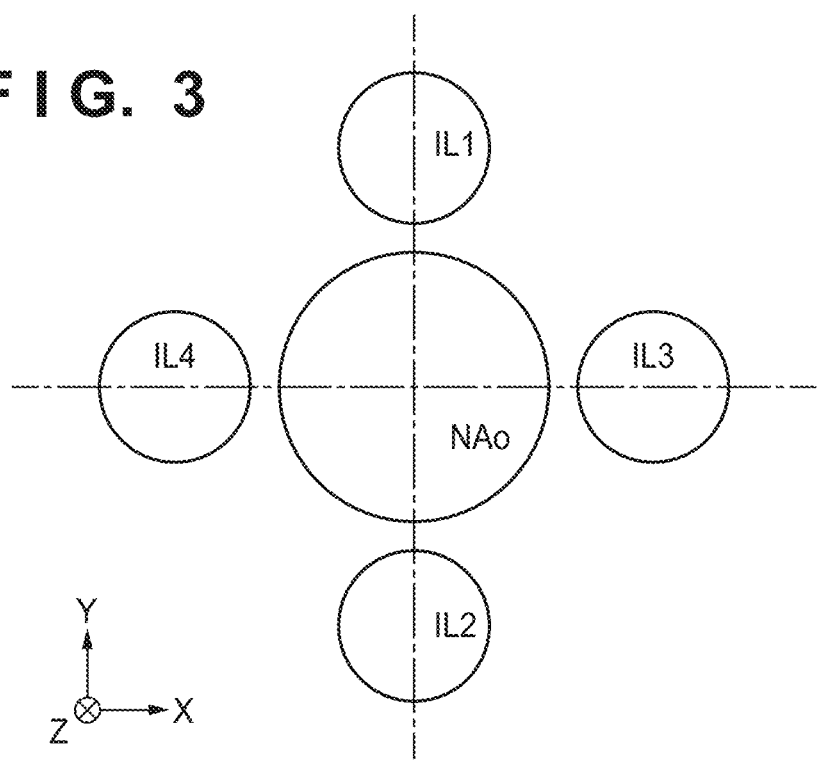
FIG. 3 is a view showing the relationship between the pupil intensity distribution of the illumination optical system of each position detection apparatus and the numerical aperture of each detection optical system.

FIG. 3 is a view showing the relationship between the pupil intensity distribution (IL1 to IL4) of the illumination optical system 22 of each position detection apparatus 6 and the numeral aperture $NA_o$ of the detection optical system 21. FIG. 3 shows the size of the pupil on the pupil plane of the illumination optical system 22 as the numeral aperture $NA_o$ of the detection optical system 21. In this embodiment, the pupil intensity distribution of the illumination optical system 22 includes a first pole IL1, a second pole IL2, a third pole IL3, and a fourth pole IL4. The illumination optical system 22 illuminates the mark 4 and the mark 5 with light which enters vertically in the direction (first direction) in which the patterns of the mark 4 or the mark 5 are arrayed and light which enters parallelly in the direction. As described above, arranging the reflecting film 24a functioning as an aperture stop on the pupil plane of the illumination optical system 22 can form a plurality of poles from the single light source 23, that is, the first pole IL1 to the fourth pole IL4. When forming a pupil intensity distribution having a plurality of poles (peaks) in this manner, it is not necessary to use a plurality of light sources, and hence it is possible to simplify or downsize the position detection apparatus 6.

Figure 4A:
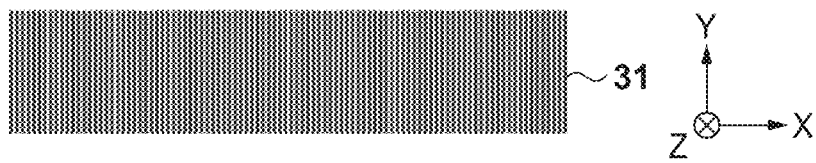
FIGS. 4A to 4D are views for explaining the principle of the occurrence of moire and the detection of the relative positions of marks by using moire.
Figure 4B:
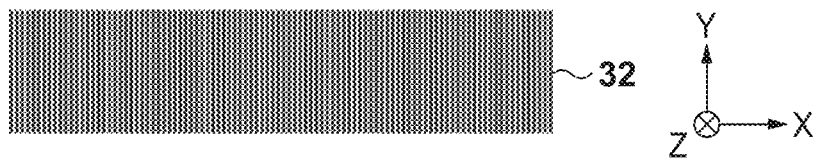

The principle of the generation of moire using diffracted light from the mark 4 and the mark 5 and the detection of the relative positions of the mark 4 (mold 2) and the mark 5 (substrate 1) by using such moire will be described with reference to FIGS. 4A to 4D. As shown in FIGS. 4A and 4B, a diffraction grating (first diffraction grating) 31 provided as the mark 4 with the mold 2 slightly differs in the period of the patterns (grating) in the measurement direction from a diffraction grating (second diffraction grating) 32 provided as the mark 5 with the substrate 1. When the two diffraction gratings different in grating period overlap each other, a pattern having a period reflecting the period difference between the diffraction gratings, that is, so-called moire, appears because of the interference between diffracted light beams from the two diffraction gratings. In this case, since the phase of the moire changes depending on the relative positions of the diffraction gratings, it is possible to obtain the relative positions of the mark 4 and the mark 5, that is, the relative positions of the mold 2 and the substrate 1, by detecting the moire.

Figure 4C:
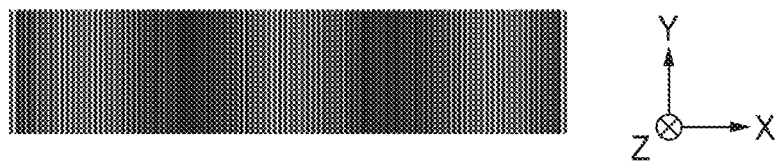
Figure 4D:
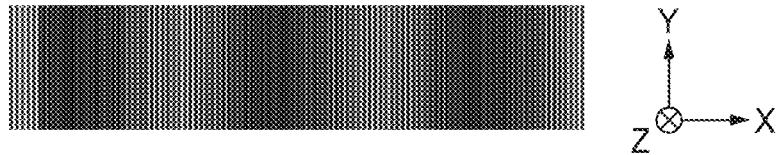

More specifically, when the diffraction grating 31 and the diffraction grating 32 having slightly different periods overlap each other, diffracted light beams from the diffraction gratings 31 and 32 overlap each other, thereby generating moire having a period reflecting the period difference, as shown in FIG. 4C. As described above, moire changes in the positions of bright and dark portions (the phase of fringes) depending on the relative positions of the diffraction grating 31 and the diffraction grating 32. For example, as the relative positions of the diffraction grating 31 and the diffraction grating 32 change in the X direction, the moire shown in FIG. 4C changes to the moire shown in FIG. 4D. Moire occurs as fringes with a large period, which increases the actual positional shift amount (change amount) between the diffraction grating 31 and the diffraction grating 32. Even if therefore the resolution of the detection optical system 21 is low, it is possible to accurately detect the relative positions of the diffraction grating 31 and the diffraction grating 32.

Consider a case in which in order to detect such moire, the diffraction gratings 31 and 32 are detected with a bright field (the diffraction gratings 31 and 32 are illuminated from the vertical direction, and the light diffracted by the diffraction gratings 31 and 32 in the vertical direction is detected). In this case, the detection optical system 21 also detects 0th-order light from the diffraction gratings 31 and 32. Since 0th-order light becomes a factor that degrades the contrast of moire, each position detection apparatus 6 has a dark field arrangement which detects no 0th-order light (that is, the diffraction gratings 31 and 32 are illuminated with oblique incident light). In this embodiment, in order to detect moire even with a dark field arrangement, one of the diffraction gratings 31 and 32 is a diffraction grating with a checkerboard pattern shown in FIG. 5A, and the other is a diffraction grating like that shown in FIG. 5B. The diffraction grating shown in FIG. 5A includes patterns periodically arrayed in the measurement direction (first direction), and patterns periodically arrayed in a direction (second direction) perpendicular to the measurement direction.

Figure 5A:
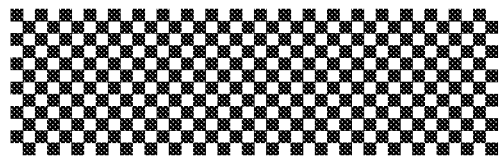
FIGS. 5A to 5D are views each showing an example of a diffraction grating provided with a mold or substrate.
Figure 5A:
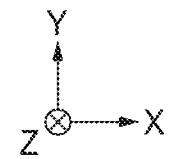
Figure 5B:
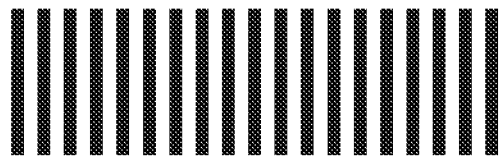
Figure 5B:
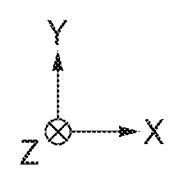

Referring to FIGS. 3, 5A, and 5B, light from the first pole IL1 and the second pole IL2 irradiates each diffraction grating and is diffracted by the diffraction grating with the checkerboard pattern. In this case, of the light diffracted by the diffraction grating, the light diffracted in the Z-axis direction is detected. The light diffracted in the Y direction has relative position information in the X direction and enters the detection region ($NA_o$) on the pupil of the detection optical system 21, and is detected by the image sensor 25. Using this can obtain the relative positions of the two diffraction gratings.

Figure 5C:
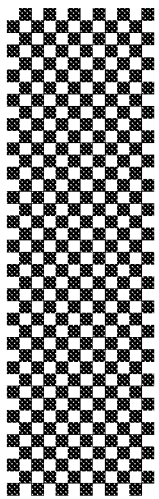
Figure 5C:
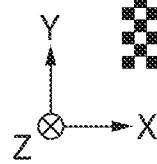
Figure 5D:
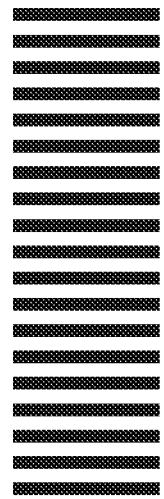
Figure 5D:
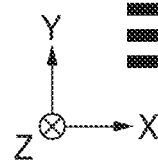

In the relationship between the pupil intensity distribution shown in FIG. 3 and the diffraction gratings shown in FIGS. 5A and 5B, light beams from the third pole IL3 and the fourth pole IL4 are not used to detect the relative positions of the diffraction gratings. However, when detecting the relative positions of the diffraction gratings shown in FIGS. 5C and 5D, light beams from the third pole IL3 and the fourth pole IL4 are used to detect the relative positions of the diffraction gratings, and light beams from the first pole IL1 and the second pole IL2 are not used to detect the relative positions of the diffraction gratings. In addition, when simultaneously detecting relative positions in two directions by arranging the pair of diffraction gratings shown in FIGS. 5A and 5B and the pair of diffraction gratings shown in FIGS. 5C and 5D in the same visual field of the detection optical system 21, the pupil intensity distribution shown in FIG. 3 is very effective.

Figure 6A:
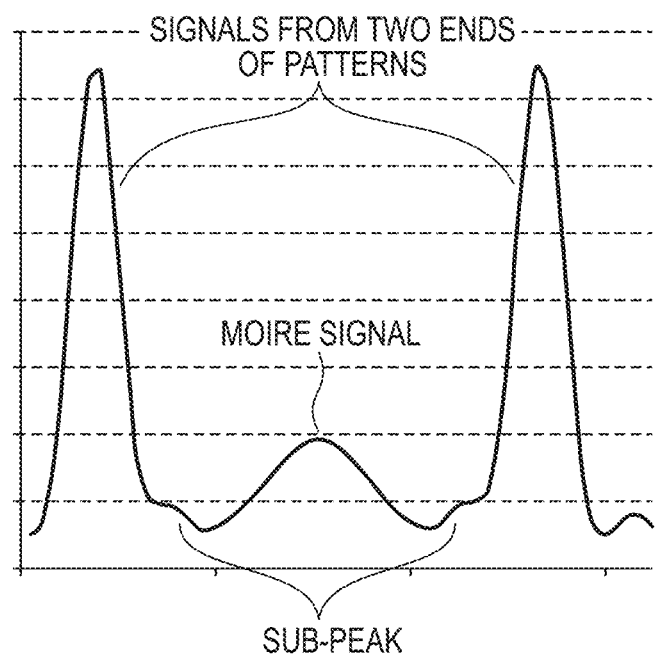
FIGS. 6A and 6B are graphs each showing a moire signal.

The influence of light in a direction which is not used to detect the relative positions of the diffraction gratings will be described below. For example, light beams from the third pole IL3 and the fourth pole IL4 are scattered or diffracted at end portions (the two ends of the patterns of each diffraction grating) of each of the pair of diffraction gratings shown in FIGS. 5A and 5B. FIG. 6A shows a moire signal (its section) obtained by an optical simulation in such a case. Referring to FIG. 6A, large signals (light) are generated at the two ends of the patterns of the diffraction grating. It can also be confirmed that a minute sub-peak is generated. These signals can be considered as large signals generated because the continuous patterns (grating condition) on the diffraction grating cease to continue. Although such a phenomenon occurs when detecting a diffraction grating with a bright field, the phenomenon becomes noticeable especially when detecting the diffraction grating with a dark field. When such signals (unnecessary light) generated at the two ends of the patterns of each diffraction grating and a sub-peak are mixed in a moire signal, an error occurs in the detection of the relative positions of the diffraction gratings.

Figures 7A, 7B:
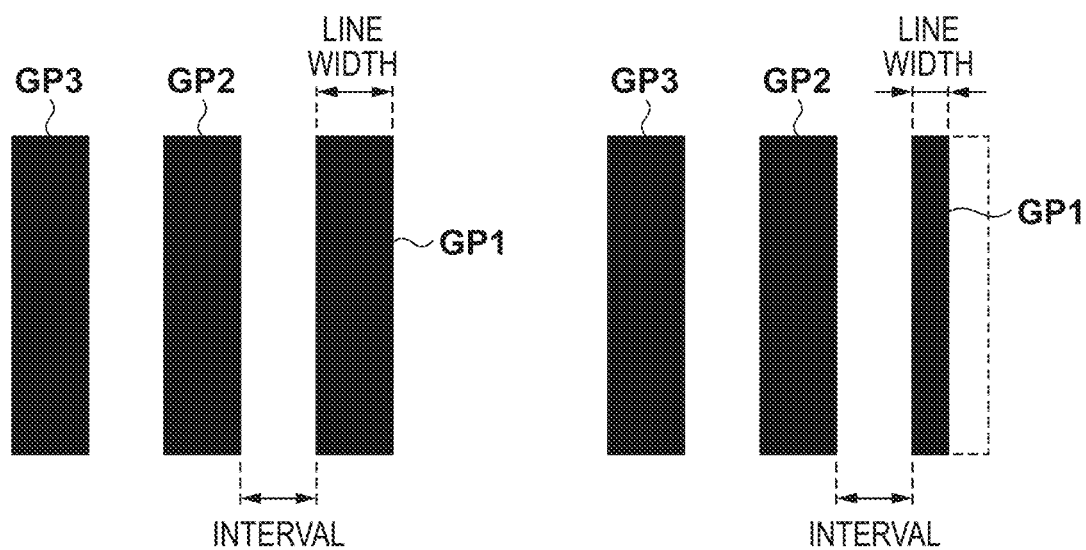
FIGS. 7A and 7B are views each showing an example of a diffraction grating provided with a mold or substrate.

This embodiment therefore reduces this influence by elaborating marks provided with the mold 2 and the substrate 1, that is, the designs of diffraction gratings. FIG. 7A is a view showing an end portion of a diffraction grating including patterns periodically arrayed in the first direction. FIG. 7A shows a pattern GP1 (a pattern on the right end) on one end portion of the patterns on the two ends of a diffraction grating, a pattern GP2 nearest to the pattern GP1, and a pattern GP3 nearest to the pattern GP2. FIG. 7A shows three patterns on the right end of the diffraction grating shown in FIG. 5B. Patterns are periodically formed on the left side of the pattern GP3. Assume that the line width of each pattern of the diffraction grating and the interval between patterns are both 1 μm.

Figure 8:
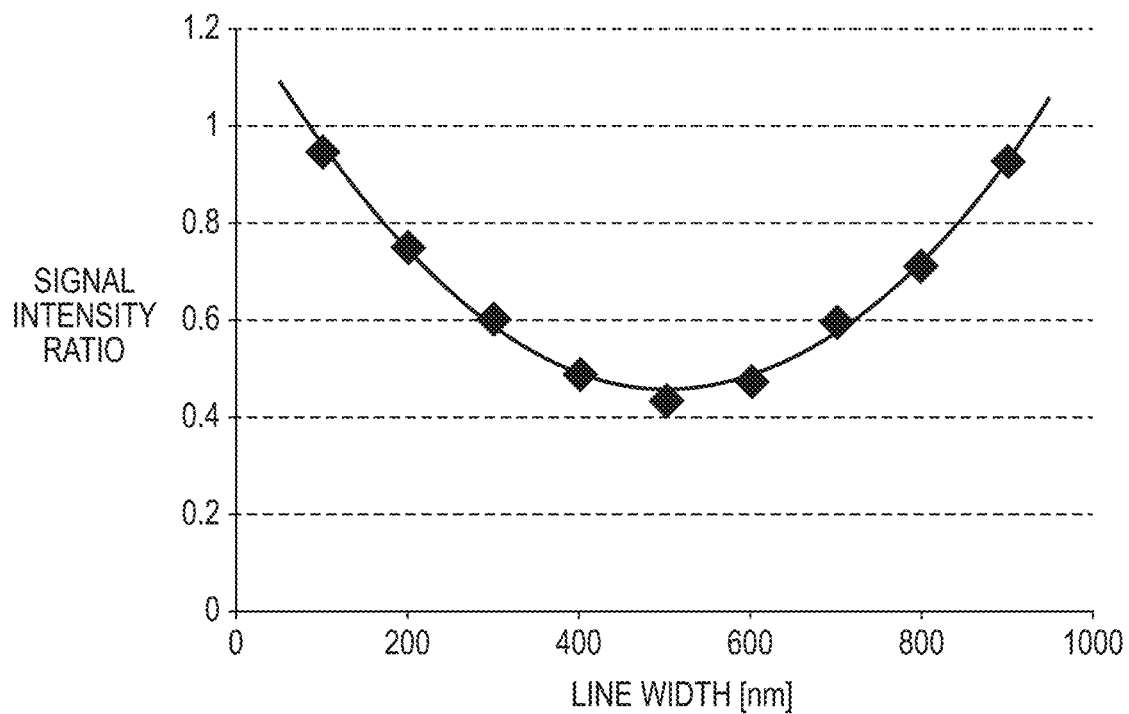
FIG. 8 is a graph showing a change in moire signal at the end portions of a diffraction grating.

FIG. 8 shows the result obtained when a change in moire signal at an end portion (pattern GP1) of the diffraction grating shown in FIG. 7A with a change in the line width of the pattern GP1 of the diffraction grating is obtained by an optical simulation. Referring to FIG. 8, the ordinate represents the relative ratio (signal intensity ratio) when the intensity of a moire signal is 1 at an end portion of the diffraction grating while the line width of the pattern GP1 and the interval between the patterns are 1 μm, and the abscissa represents the line width of the pattern GP1.

Referring to FIG. 8, it is obvious that the intensity of a moire signal at the end portion of a diffraction grating can be reduced by making the line width of the pattern GP1 on an end of the diffraction grating smaller than the line width of the remaining patterns including the patterns GP2 and GP3. In addition, it is obvious that the intensity of the moire signal at the end portion of the diffraction grating can be minimized by decreasing the line width of the pattern GP1 to ½ (500 nm in this embodiment) of that of the remaining patterns including the patterns GP2 and GP3.

Figure 6B:
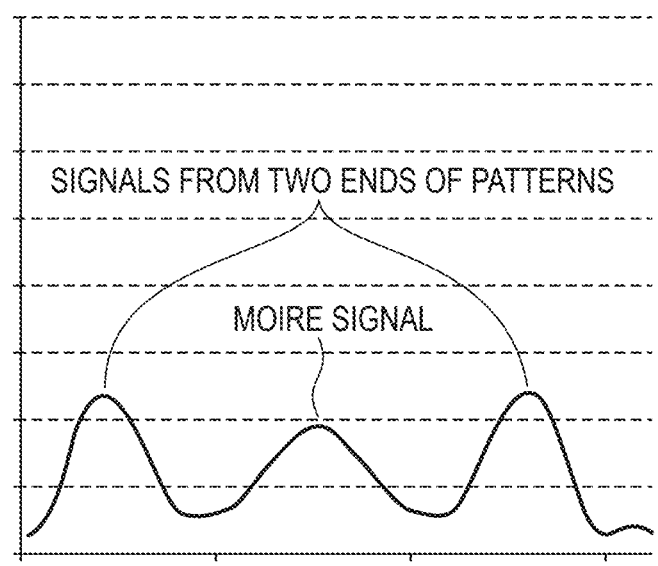

In this embodiment, therefore, as shown in FIG. 7B, the line width of the pattern GP1 on the end of the diffraction grating is set to be smaller than that of the remaining patterns including the patterns GP2 and the GP3. FIG. 6B shows the moire signal (its section) obtained by an optical simulation when the line width of the pattern GP1 on the end of the diffraction grating is set to 500 nm, which is ½ of that of the remaining patterns including the patterns GP2 and the GP3. Note that the remaining patterns including the patterns GP2 and GP3 have the same line width.

Referring to FIG. 6B, it is obvious that as the intensities of the moire signal at the two ends of the patterns of the diffraction grating decrease, the sub-peak decreases. Note however that there is no change in the moire signal used for the detection of the relative positions of the diffraction gratings. It is assumed that this is because when the line width of the patterns on the two ends of the diffraction grating is set to be smaller than that of the remaining patterns, light beams having different phases are generated from the patterns on the two ends and the remaining patterns so as to reduce (cancel) the light beams from the patterns on the two ends. In contrast to this, when the line width of the patterns on the two ends of the diffraction grating is set to be larger than that of the remaining patterns, the obtained result indicates that the intensity of a signal from each end portion of the diffraction grating increases. As described above, it is possible to reduce the generation of unnecessary light by making a pattern, of the patterns included in a diffraction grating, which generates light unnecessary for a signal required for relative position measurement have a line width smaller than that of the remaining patterns.

Figure 9:
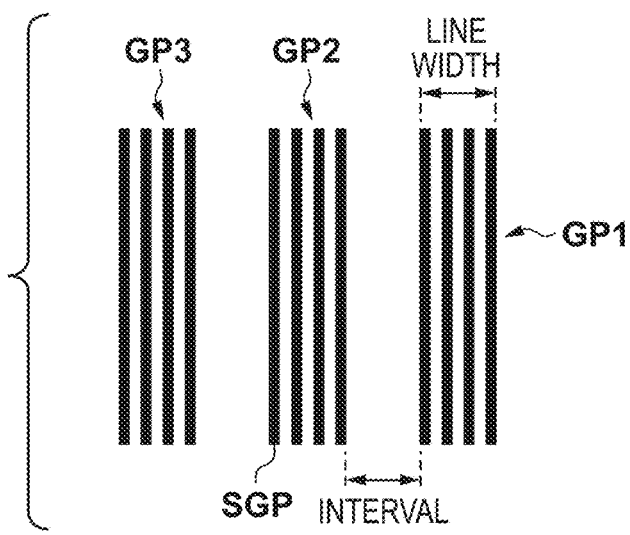
FIG. 9 is a view showing an example of a diffraction grating provided with a mold or substrate.

This embodiment has exemplified the diffraction grating shown in FIG. 5B. However, a similar result is obtained by using a diffraction grating with a checkerboard pattern like that shown in FIG. 5A. In some cases, as shown in FIG. 9, each of the pattern GP1 on the end of the diffraction grating and the remaining patterns including the patterns GP2 and GP3 is constituted by a plurality of segments SGP (a so-called segment mark constituted by a set of fine lines). In such a case, the width of a set of a plurality of segments SGP constituting one pattern may be regarded as the line width of the pattern, and the interval between a set of a plurality of segments SGP constituting one pattern and a set of a plurality of segments SGP constituting another pattern may be regarded as the interval between the patterns. In addition, in some cases, a fine dummy pattern is formed between patterns of a diffraction grating. However, such a dummy pattern is a pattern which is not directly associated with the detection of the relative positions of the diffraction gratings, and hence need not be considered.

As described above, in this embodiment, patterns on the two ends of at least one of the diffraction grating (mark 4) provided with the mold 2 and the diffraction grating (mark 5) provided with the substrate 1 are made to have a line width smaller than that of the remaining patterns. This makes it possible to reduce (prevent) the generation of strong diffracted light and scattered light from the end portions (patterns on the two ends) of the diffraction grating provided with the mold 2 or the substrate 1 and to make the position detection apparatus 6 accurately detect the relative positions of the diffraction gratings. Therefore, the imprint apparatus 100 can accurately align the mold 2 with the substrate 1 based on the detection result obtained by the position detection apparatus 6, and can reduce pattern transfer failures (product failures).

Second Embodiment

Figure 10:
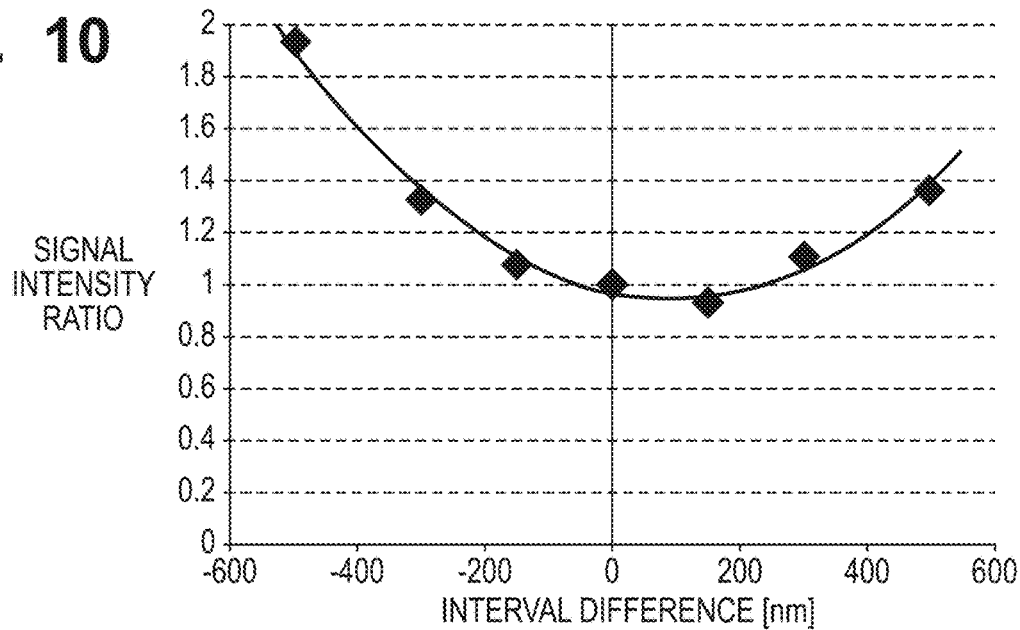
FIG. 10 is a graph showing a change in moire signal at the end portions of a diffraction grating.

It is possible to change signals from the two ends of the patterns of the diffraction grating shown in FIG. 7A by changing the interval between a pattern GP1 on an end of the diffraction grating and a pattern GP2 nearest to the pattern GP1 (that is, located nearer to the inside by one pattern). FIG. 10 shows the result obtained by an optical simulation of a change in signal from the end portion of the diffraction grating (pattern GP1) with a change in the interval between the pattern GP1 and the pattern GP2 of the diffraction grating shown in FIG. 7A. Referring to FIG. 10, the interval between the remaining patterns including the pattern GP2 and a pattern GP3 of the diffraction grating is 1 μm, and the abscissa represents the difference (interval difference) between 1 μm and the interval between the patterns GP1 and GP2. On the abscissa, the minus direction indicates a direction in which the interval between the pattern GP1 and the pattern GP2 decreases, and the plus direction indicates a direction in which the interval between the pattern GP1 and the pattern GP2 increases. In addition, the ordinate represents the relative ratio (signal intensity ratio) when the interval between the pattern GP1 and the pattern GP2 of the diffraction grating is 1 μm and the intensity of a signal from an end portion of the diffraction grating is 1.

Referring to FIG. 10, the interval between the pattern GP1 and the pattern GP2 of the diffraction grating is made to be larger than the interval between the remaining patterns within the range of the line width of the pattern GP1 or the pattern GP2. More specifically, it is possible to decrease the intensity of a signal from an end portion of the diffraction grating by setting the interval between the pattern GP1 and the pattern GP2 of the diffraction grating to an interval 1.3 times or less the interval between the remaining patterns. It is also obvious that the intensity of a signal from an end portion of a diffraction grating can be minimized by setting the interval between the pattern GP1 and the pattern GP2 of the diffraction grating to an interval 1.15 times the interval between the remaining patterns, that is, to interval difference +150 nm in this embodiment. As described above, it is assumed that this is because light beams having different phases are generated from patterns on the two ends of a diffraction grating and the remaining patterns to reduce (cancel) the light beams from the patterns on the two ends.

Figure 11:
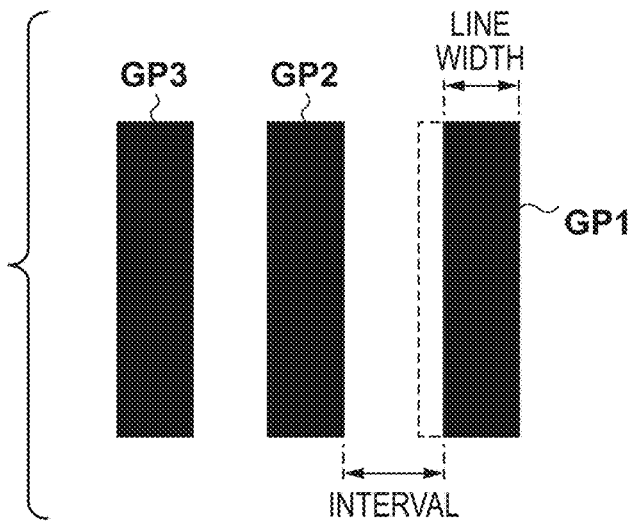
FIG. 11 is a view showing an example of a diffraction grating provided with a mold or substrate.

In this embodiment, therefore, as shown in FIG. 11, the interval between the pattern GP1 on the end of the diffraction grating and the pattern GP2 nearest to the pattern GP1 is set to be larger than the interval between the remaining patterns (for example, the interval between the pattern GP2 and the pattern GP3). Note that the intervals between the remaining patterns including the patterns GP2 and GP3 of the diffraction grating are the same. This makes it possible to reduce (prevent) the generation of diffracted light and scattered light from the end portions (patterns on the two ends) of the diffraction grating provided with a mold 2 or substrate 1 and to make the position detection apparatus 6 accurately detect the relative positions of the diffraction gratings. Therefore, an imprint apparatus 100 can accurately align the mold 2 with the substrate 1 based on the detection result obtained by a position detection apparatus 6, and can reduce pattern transfer failures (product failures).

Third Embodiment

In order to reduce the intensity of a signal from each end portion of a diffraction grating, light beams having different phases may be respectively generated from the patterns on the two ends of the diffraction grating and the remaining patterns. Therefore, at least one of the diffraction gratings respectively provided with a mold 2 and a substrate 1 may have a structure which makes light from the patterns on the two ends and light from the remaining patterns have different phases when light having the same phase enters the diffraction grating.

A structure which makes light from the patterns on the two ends of a diffraction grating and light from the remaining patterns have different phases can be formed by using materials having different refractive indices for the patterns on the two ends of the diffraction grating and the remaining patterns. In addition, such a structure can be formed by using materials having different thicknesses for the patterns on the two ends of the diffraction grating and the remaining patterns. Furthermore, such a structure can be formed by making steps forming the patterns on the two ends of the diffraction grating have a depth different from that of steps forming the remaining patterns.

Fourth Embodiment

In the first and second embodiments, signals (unnecessary light) generated at the two ends of the patterns of a diffraction grating are reduced by decreasing the line widths of the patterns on the two ends of the diffraction grating without upsizing the diffraction grating (mark 4 or mark 5), as described above.

This embodiment will explain the patterns of a diffraction grating which reduces unnecessary light generated from the patterns of the diffraction grating by upsizing the diffraction grating. As described above, it is considered that unnecessary light from the end portions (patterns on the two ends) of the diffraction grating is generated because the continuous patterns of the diffraction grating cease to continue.

Figure 12A:
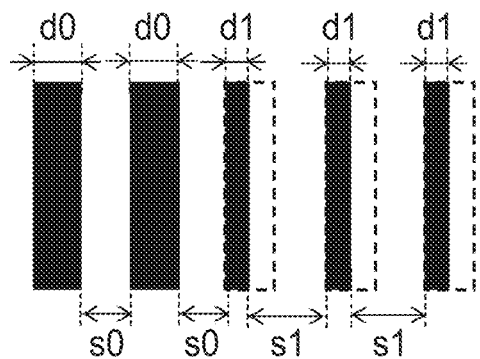
FIGS. 12A to 12D are views showing an example of a diffraction grating provided with a mold or substrate.

In this embodiment, in order to relax the cease of continuation of continuous patterns of a diffraction grating at end portions, the line width of a plurality of patterns including at least a pattern on the end of the diffraction grating is set to be smaller than that of the remaining patterns of the diffraction grating, as shown in FIG. 12A. This can more effectively reduce unnecessary light from the end portions of the diffraction grating. In FIG. 12A, the line width of a pattern (to be referred to as a "first pattern" hereinafter) at a portion of the diffraction grating used for measurement is set to be d0, and the interval between adjacent first patterns is set to be s0. Also, in order to reduce unnecessary light from the end portions of the diffraction grating, the line width of a plurality of patterns (to be referred to as "second patterns" hereinafter) including at least a pattern on the end of the diffraction grating is set to be d1, and the interval between adjacent second patterns is set to be s1. The line width d1 of the second pattern is smaller than the line width d0 of the first pattern (d0>d1). The interval s1 between adjacent second patterns is equal to or larger than the interval s0 between adjacent first patterns (s0≤s1). As shown in FIG. 12A, the interval s1 between adjacent second patterns is larger by a decrease (d0−d1) in the line width d1 of the second pattern from the line width d0 of the first pattern.

Figure 12B:
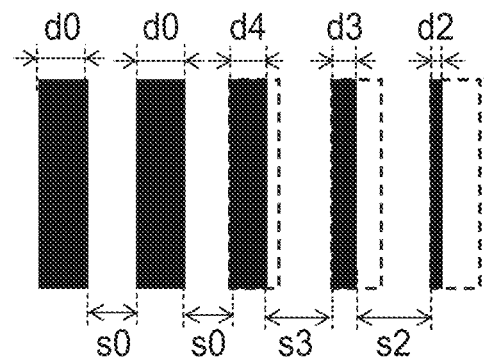

The line widths of a plurality of second patterns (three patterns from the end of the diffraction grating in FIG. 12A) need not be uniform, as shown in FIG. 12A, in order to reduce unnecessary light from the end portions of the diffraction grating. For example, as shown in FIG. 12B, the line widths of a plurality of second patterns may be changed, that is, decreased continuously toward the end portion of the diffraction grating. This can more effectively reduce unnecessary light from the end portions of the diffraction grating.

A case in which the number of second patterns whose line width is to be changed is n will be examined. In this case, it has been confirmed by simulation that the effect of reducing unnecessary light from the end portions of the diffraction grating is obtained by continuously decreasing the line width of the second pattern by a value obtained by dividing the line width (line width d0) before change by (n+1).

When changing the line widths of three second patterns, as shown in FIG. 12B, line widths d4, d3, and d2 of the three second patterns are set as follows toward the end portion of the diffraction grating:

$$d4=\tfrac{3}{4}\times d0$$

$$d3=\tfrac{2}{4}\times d0$$

$$d2=\tfrac{1}{4}\times d0$$

It is known that the effect of reducing unnecessary light from the end portions of the diffraction grating is enhanced by setting the line widths d4, d3, and d2 of the second patterns in this manner.

In FIG. 12B, intervals s2 and s3 between adjacent second patterns are widened by decreases in the line width d1 of the second pattern from the line width d0 of the first pattern, as in FIG. 12A. However, this is not exhaustive. It is only necessary that the intervals s2 and s3 between adjacent second patterns satisfy s0≤s2 and s0≤s3, as in FIG. 12A.

Figure 12C:
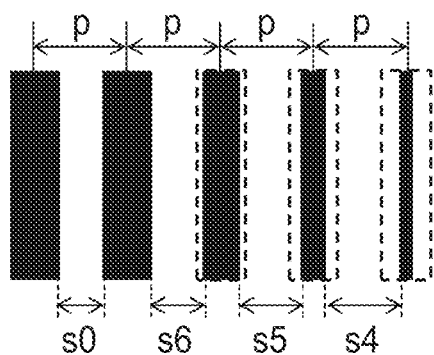

Alternatively, as shown in FIG. 12C, intervals s0, s6, s5, and s4 between adjacent patterns may be changed continuously, that is, widened continuously toward the end portion of the diffraction grating. Note that the line width of the first pattern and that of the second pattern are the same as those in FIG. 12B (the line width of the first pattern: d0, the line width of the second pattern (toward the end portion of the diffraction grating): d4, d3, d2). Particularly when intervals s6, s5, and s4 between adjacent patterns are set to be the same periodic pitch as a periodic pitch p of a pattern of the diffraction grating used for measurement, that is, the first pattern, unnecessary light from the end portions of the diffraction grating can be reduced effectively.

Figure 12D:
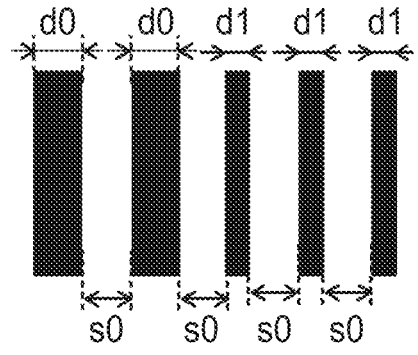

Alternatively, as shown in FIG. 12D, the line width of a plurality of second patterns including a pattern on the end of the diffraction grating may be set to be d1, as in FIG. 12A, and the interval between adjacent second patterns may be set to be s0 as well as the interval between adjacent first patterns. Even if the intervals between adjacent second patterns are set to be constant, unnecessary light from the end portions of the diffraction grating can be reduced by setting the line width of the second pattern to be smaller than that of the first pattern. Further, even when the line widths of the second patterns are changed continuously toward the end portion of the diffraction grating, as shown in FIG. 12B, the interval between adjacent second patterns may be set to be s0 as well as the interval between adjacent first patterns.

Fifth Embodiment

When unnecessary light from the end portions of a diffraction grating is reduced by setting the line width of a plurality of patterns including pattern on the end of the diffraction grating to be smaller than the line width of the remaining patterns of the diffraction grating, as in the fourth embodiment, the line width of the pattern on the end need not be minimum.

Figure 13A:
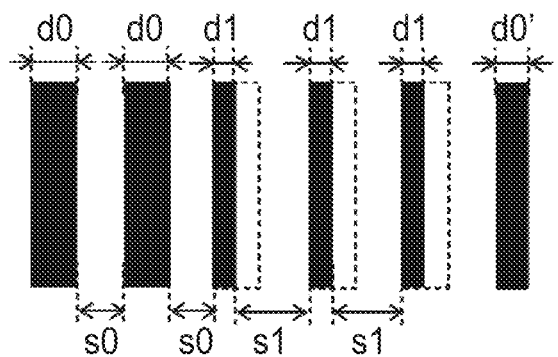
FIGS. 13A to 13D are views showing an example of a diffraction grating provided with a mold or substrate.

In this embodiment, the line width of a pattern on the end of a diffraction grating, of a plurality of second patterns including the pattern on the end, is set to be larger than the line width of the remaining second patterns. For example, as shown in FIG. 13A, the line width of the first pattern of the diffraction grating used for measurement is set to be d0, and a line width d0' of a pattern on the end is set to be larger than a line width d1 of the remaining second patterns excluding the pattern on the end (d0>d0'>d1). Therefore, the effect of reducing unnecessary light from the end portions of the diffraction grating can be obtained, unlike a related art in which the line width of the diffraction grating is constant.

Figure 13B:
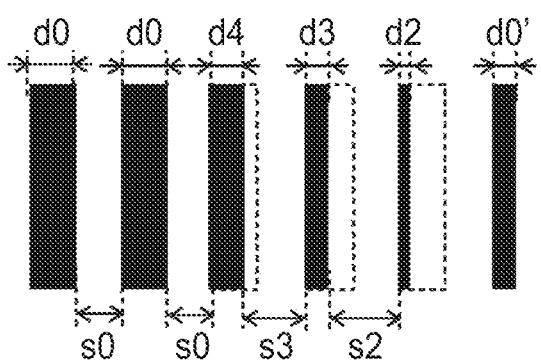
Figure 13C:
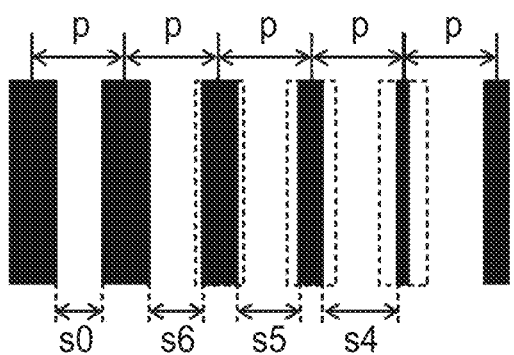
Figure 13D:
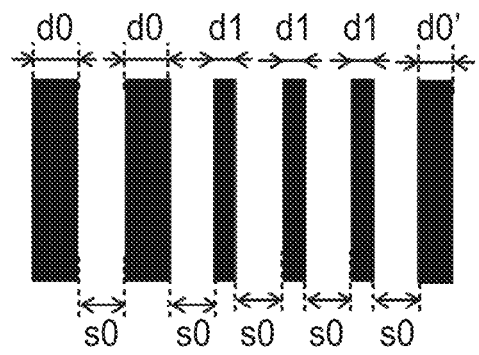

FIG. 13A shows a diffraction grating in which a pattern having the line width d0' (>d1) larger than the line width d1 is added to the end portion of the diffraction grating shown in FIG. 12A. FIG. 13B shows a diffraction grating in which a pattern having the line width d0' (>d2) larger than the line width d2 is added to the end portion of the diffraction grating shown in FIG. 12B. FIG. 13C shows a diffraction grating in which a pattern having a line width larger than the line width of a pattern on the end of the diffraction grating shown in FIG. 12C is added to the end portion of the diffraction grating. FIG. 13D shows a diffraction grating in which a pattern having the line width d0' (>d1) larger than the line width d1 is added to the end portion of the diffraction grating shown in FIG. 12D.

In this manner, when the line width of a plurality of patterns including a pattern on the end of a diffraction grating is set to be smaller than the line width of the remaining patterns of the diffraction grating, a pattern larger in line width than a pattern having a small line width may be arranged at the end portion of the diffraction grating. In other words, the line width of the pattern on the end of the diffraction grating need not be minimum. Even in this case, the effect of reducing unnecessary light from the end portions of the diffraction grating can be obtained.

Sixth Embodiment

In the second embodiment, unnecessary light from the end portions of a diffraction grating is reduced by setting the interval between a pattern on the end of the diffraction grating and a pattern closest to this pattern to be wider than the interval between the remaining patterns (patterns used for measurement). In this case, the interval between a plurality of patterns may be widened, in addition to the interval between the pattern on the end of the diffraction grating and the pattern closest to this pattern.

Figure 14A:
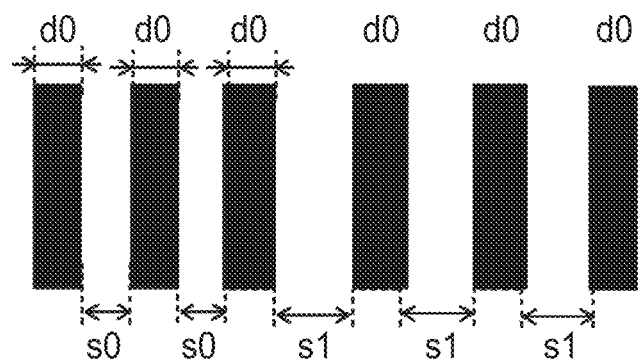
FIGS. 14A and 14B are views showing an example of a diffraction grating provided with a mold or substrate.

In this embodiment, the interval between a plurality of patterns including a pattern on the end of a diffraction grating is set to be wider than the interval between the first patterns of the diffraction grating used for measurement. For example, in FIG. 14A, as for three second patterns from the end of a diffraction grating, an interval s1 between adjacent patterns is set to be wider than an interval s0 between the first patterns. The line width of the second pattern is set to be d0 as well as the line width of the first pattern. In this way, the effect of reducing unnecessary light from the end portions of a diffraction grating can be obtained by widening the interval between a plurality of patterns of the diffraction grating. In FIG. 14A, all the intervals between a plurality of patterns are set to be s1, but some of these intervals may be smaller than s1. For example, the interval between a pattern on the end of the diffraction grating and a pattern closest to this pattern may be set to be s0.

Figure 14B:
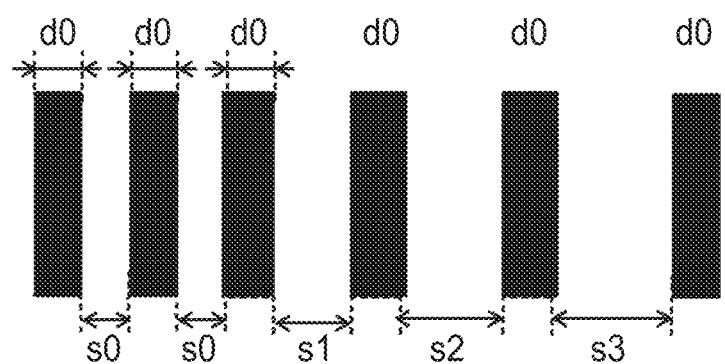

In addition, as shown in FIG. 14B, as for three second patterns from the end of a diffraction grating, the intervals between adjacent patterns may be widened to be s1, s2, and s3 toward the end portion of the diffraction grating. The intervals s1, s2, and s3 between adjacent patterns are set to be wider than the interval s0 between first patterns used for measurement (s0<s1<s2<s3). The line width of the second pattern is set to be d0 as well as the line width of the first pattern. In this fashion, the effect of reducing unnecessary light from the end portions of a diffraction grating can be obtained by widening the intervals between a plurality of patterns of the diffraction grating. In FIG. 14B, the intervals between adjacent patterns are sequentially widened toward the end portion of the diffraction grating. However, this is not exhaustive. For example, as long as a plurality of patterns are arranged at an interval wider than the interval s0 between first patterns, this interval need not be wider in sequence toward the end portion of the diffraction grating. For example, some of the intervals between a plurality of patterns may be set to be s0.

Although the above embodiments have exemplified a diffraction grating in which line patterns are arrayed, this is not exhaustive. The same effect can be obtained even by a checkerboard diffraction grating, as described above. The above embodiments have described a case in which the line width or interval of a pattern on the right end, of the patterns of a diffraction grating, is changed. However, the line width or interval of a pattern on the left end can also be changed in the same way. Further, a diffraction grating explained in each embodiment may be formed as at least one of the diffraction grating (first diffraction grating) 31 and the diffraction grating (second diffraction grating) 32, and may be formed as both of the diffraction grating 31 and the diffraction grating 32. By using such a diffraction grating, generation of unnecessary light when detecting moire can be reduced.

In addition, FIGS. 15A to 15C are views showing a relationship between moire signal and a diffraction grating, and compare a relative position between the moire signal and marks of the diffraction grating. Since signals (unnecessary light) generated at the end portions (patterns on the two ends) of the diffraction grating are mixed in the moire signal, moire signal from patterns (measurement used range), used for measurement, of the diffraction grating is used for measurement of the relative position. Therefore, patterns (measurement non-used range), which are not used for measurement, of the diffraction grating, that is, patterns which generate the unnecessary light do not have an influence for measurement. The first patterns of the diffraction grating explained in the fourth, fifth, and sixth embodiments may be used as patterns of measurement used range and the second patterns of the diffraction grating may be used as patterns of measurement non-used range. The patterns of each of the above embodiments can be applied to the patterns of measurement non-used range of the patterns of the diffraction grating shown in FIGS. 15B and 15C. For example, the present invention can be applied to at least a part of patterns of the patterns of measurement non-used range, and the present invention can be applied to all patterns of the patterns of measurement non-used range.

If patterns of measurement used range is increased, a diffraction grating is upsized, and therefore it is difficult to provide the diffraction grating on the substrate or mold. However, if the diffraction garaging is not upsized, the patterns of measurement used range are reduced, and measurement accuracy is deteriorated. Therefore, the patterns are downsized while measurement non-used range is reduced as possible, or measurement used range is enlarged. The size of patterns of the diffraction grating is determined based on required accuracy.

Seventh Embodiment

A method of manufacturing a device (a semiconductor device, magnetic storage medium, liquid crystal display element, or the like) as an article will be described. This manufacturing method includes a step of causing the imprint apparatus 100 to form a pattern on a substrate (a wafer, glass plate, film-like substrate, or the like). The manufacturing method also includes a step of processing the substrate on which the pattern is formed. This processing step can include a step of removing the residual film of the pattern. In addition, the method can include other known steps such as a step of etching the substrate using the pattern as a mask. The method of manufacturing an article according to this embodiment is advantageous over the related art in terms of at least the performance, quality, productivity, or production cost of articles.

In addition, the arrangements of diffraction gratings respectively explained in the first, second, third, fourth, fifth and sixth embodiments may be combined as needed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2014-133245 filed Jun. 27, 2014, and 2015-116883 filed Jun. 9, 2015 which are hereby incorporated by reference herein in their entirety.

What is claimed is:

1. A position detection method comprising steps of:
    detecting moire caused by overlap between a first diffraction grating including a plurality of patterns arrayed and a second diffraction grating including a plurality of patterns arrayed; and
    obtaining a relative position of the first diffraction grating and the second diffraction grating based on the moire,
    wherein a pitch of the plurality of patterns of the first diffraction grating is constant and a pitch of the plurality of patterns of the second diffraction grating is constant,
    wherein the pitch of the plurality of patterns of the first diffraction grating and the pitch of the plurality of patterns of the second diffraction grating are different from each other, and
    wherein a width of the pattern at an end portion of the plurality of patterns of the first diffraction grating is smaller than widths of remaining patterns of the plurality of patterns of the first diffraction grating, or
    wherein the width of the pattern at the end portion of the plurality of patterns of the first diffraction grating is smaller than the widths of the remaining patterns of the plurality of patterns of the first diffraction grating and a width of the pattern at an end portion of the plurality of patterns of the second diffraction grating is smaller than widths of remaining patterns of the plurality of patterns of the second diffraction grating.

2. The method according to claim 1, wherein the widths of the remaining patterns of the plurality of patterns of the first diffraction grating are the same.

3. The method according to claim 1, wherein the width of the pattern at the end portion of the plurality of patterns of the first diffraction grating is ½ of the width of the remaining patterns of the plurality of patterns of the first diffraction grating.

4. The method according to claim 1, wherein an interval between the pattern at the end portion of the plurality of patterns of the first diffraction grating and another pattern nearest to the pattern at the end portion of the first diffraction grating is wider than intervals between the remaining patterns of the plurality of patterns of the first diffraction grating.

5. The method according to claim 4, wherein the intervals between the remaining patterns of the plurality of patterns of the first diffraction grating are the same.

6. The method according to claim 1, wherein the plurality of patterns of the first diffraction grating is arrayed in a first direction.

7. The method according to claim 6, wherein at least one of the first diffraction grating or the second diffraction grating includes a plurality of patterns arrayed in a second direction perpendicular to the first direction.

8. The method according to claim 1, wherein each of the plurality of patterns of the first diffraction grating comprises a plurality of segments.

9. The method according to claim 6, further comprising illuminating the first diffraction grating and the second diffraction grating with light entering vertically in the first direction and light entering parallelly in the first direction.

10. A position detection method comprising:
    detecting moire caused by overlap between a first diffraction grating including a plurality of patterns arrayed and a second diffraction grating including a plurality of patterns arrayed; and obtaining a relative position of the first diffraction grating and the second diffraction grating based on the moire, wherein a pitch of the plurality of patterns of the first diffraction grating is constant and a pitch of the plurality of patterns of the second diffraction grating is constant, wherein the pitch of the plurality of patterns of the first diffraction grating and the pitch of the plurality of patterns of the second diffraction grating are different from each other, and wherein an interval between a pattern at an end portion and a pattern adjacent to the pattern at the end portion of the plurality of patterns of the first diffraction grating is wider than an interval between adjacent patterns of remaining patterns of the plurality of patterns of the first diffraction grating, or wherein the interval between the pattern at the end portion and the pattern adjacent to the pattern at the end portion of the plurality of patterns of the first diffraction grating is wider than the interval between the adjacent patterns of remaining patterns of the plurality of patterns of the first diffraction grating and an interval between a pattern at an end portion and a pattern adjacent to the pattern at the end portion of the plurality of patterns of the second diffraction grating is wider than an interval between adjacent patterns of remaining patterns of the plurality of patterns of the second diffraction grating.

11. The method according to claim 10, wherein the interval between the pattern at the end portion and the pattern adjacent to the pattern at the end portion of the plurality of patterns of the first diffraction grating is not more than 1.3 times the interval between the adjacent patterns of the remaining patterns of the plurality of patterns of the first diffraction grating.

12. The method according to claim 10, wherein the interval between the pattern at the end portion and the pattern adjacent to the pattern at the end portion of the plurality of patterns of the first diffraction grating is 1.15 times the interval between the adjacent patterns in the remaining patterns of the plurality of patterns of the first diffraction grating.

13. The method according to claim 10, wherein the plurality of patterns of the first diffraction is arrayed in a first direction.

14. The method according to claim 13, wherein at least one of the first diffraction grating or the second diffraction grating includes a plurality of patterns arrayed in a second direction perpendicular to the first direction.

15. The method according to claim 10, wherein each of the plurality of patterns comprises a plurality of segments.

16. The method according to claim 13, further comprising illuminating the first diffraction grating and the second diffraction grating with light entering vertically in the first direction and light entering parallelly in the first direction.

17. A position detection method comprising:
detecting moire caused by overlap between a first diffraction grating in which a plurality of patterns is arrayed and a second diffraction grating in which a plurality of patterns is arrayed; and
obtaining a relative position of the first diffraction grating and the second diffraction grating based on the moire,
wherein a pitch of the plurality of patterns of the first diffraction grating is constant and a pitch of the plurality of patterns of the second diffraction grating is constant,
wherein the pitch of the plurality of patterns of the first diffraction grating and the pitch of the plurality of patterns of the second diffraction grating are different from each other,
wherein the first diffraction grating includes a peripheral region that includes at least one pattern including a pattern at an end portion of the plurality of patterns of the first diffraction grating, and a central region that includes remaining patterns of the plurality of patterns of the first diffraction grating, and
wherein a width of each of all patterns in the peripheral region of the first diffraction grating is smaller than a width of each of the remaining patterns in the central region of the first diffraction grating.

18. The method according to claim 17, wherein:
the second diffraction grating includes a peripheral region that includes at least one pattern including a pattern at an end portion of the plurality of patterns of the second diffraction grating, and a central region that includes remaining patterns of the plurality of patterns of the second diffraction grating, and
a width of each of all patterns in the peripheral region of the second diffraction grating is smaller than a width of each of the remaining patterns in the central region of the second diffraction grating.

19. The method according to claim 17, wherein each of the remaining patterns in the central region of the first diffraction grating has the same width as each other.

20. The method according to claim 17, wherein the width of the pattern in the peripheral region of the first diffraction grating becomes continuously smaller toward the pattern at the end portion of the plurality of patterns of the first diffraction grating.

21. A position detection method comprising:
detecting moire caused by overlap between a first diffraction grating in which a plurality of patterns is arrayed and a second diffraction grating in which a plurality of patterns is arrayed; and
obtaining a relative position of the first diffraction grating and the second diffraction grating based on the moire,
wherein a pitch of the plurality of patterns of the first diffraction grating is constant and a pitch of the plurality of patterns of the second diffraction grating is constant,
wherein the pitch of the plurality of patterns of the first diffraction grating and the pitch of the plurality of patterns of the second diffraction grating are different from each other,
wherein the first diffraction grating includes a peripheral region that includes at least two patterns including a pattern at an end portion of the plurality of patterns of the first diffraction grating, and a central region that includes remaining patterns of the plurality of patterns of the first diffraction grating, and
wherein an interval between adjacent patterns of all patterns in the peripheral region of the first diffraction grating is wider than each interval between adjacent patterns of the remaining patterns in the central region of the first diffraction grating.

22. The method according to claim 21, wherein:
the second diffraction grating includes a peripheral region that includes at least two patterns including a pattern at an end portion of the plurality of patterns of the second diffraction grating, and a central region that includes remaining patterns of the plurality of patterns of the second diffraction grating, and an interval between adjacent patterns of all patterns in the peripheral region of the second diffraction grating is wider than each interval between adjacent patterns of the remaining patterns in the central region of the second diffraction grating.

23. The method according to claim 21, wherein each interval between adjacent patterns of patterns in the central region of the first diffraction grating is the same interval as each other.

24. The apparatus according to claim 21, wherein each interval between adjacent patterns of patterns in the peripheral region of the first diffraction grating becomes continuously wider toward an end.

25. A position detection method comprising:
  detecting moire caused by overlap between a first diffraction grating in which a plurality of patterns is arrayed and a second diffraction grating in which a plurality of patterns is arrayed; and
  obtaining a relative position of the first diffraction grating and the second diffraction grating based on the moire,
  wherein a pitch of the plurality of patterns of the first diffraction grating is constant and a pitch of the plurality of patterns of the second diffraction grating is constant,
  wherein the pitch of the plurality of patterns of the first diffraction grating and the pitch of the plurality of patterns of the second diffraction grating are different from each other, and
  wherein a width of a first pattern as a pattern at an end portion, each of widths of the first pattern and a second pattern adjacent to the first pattern, or each of widths of the first pattern, the second pattern, and a third pattern adjacent to the second pattern, of the plurality of patterns of the first diffraction grating is smaller than widths of remaining patterns of the plurality of patterns of the first diffraction grating.

26. The method according to claim 25, wherein a width of a fourth pattern as a pattern at an end portion, each of widths of the fourth pattern and a fifth pattern adjacent to the fourth pattern, or each of widths of the fourth pattern, the fifth pattern and a sixth pattern adjacent to the fifth pattern, of the plurality of patterns of the second diffraction grating is smaller than widths of remaining patterns of the plurality of patterns of the second diffraction grating.

27. The method according to claim 25, wherein each of the remaining patterns of the plurality of patterns of the first diffraction grating has the same width as each other.

28. The method according to claim 25, wherein a width of the third pattern of the first diffraction grating is smaller than widths of the remaining patterns of the first diffraction grating, a width of the second pattern is smaller than the width of the third pattern, and the width of the first pattern is smaller than the width of the second pattern.

29. The method according to claim 26, wherein a width of the sixth pattern of the second diffraction grating is smaller than widths of the remaining patterns of the second diffraction grating, a width of the fifth pattern is smaller than the width of the sixth pattern, and the width of the fourth pattern is smaller than the width of the fifth pattern.

30. A position detection method comprising:
  detecting moire caused by overlap between a first diffraction grating in which a plurality of patterns is arrayed and a second diffraction grating in which a plurality of patterns is arrayed; and
  obtaining a relative position of the first diffraction grating and the second diffraction grating based on the moire,
  wherein a pitch of the plurality of patterns of the first diffraction grating is constant and a pitch of the plurality of patterns of the second diffraction grating is constant,
  wherein the pitch of the plurality of patterns of the first diffraction grating and the pitch of the plurality of patterns of the second diffraction grating are different from each other, and
  wherein a first interval between a first pattern as a pattern at an end portion and a second pattern adjacent to the first pattern, each of the first interval and a second interval between the second pattern and a third pattern adjacent to the second pattern, or each of the first interval, the second interval, and a third interval between the third pattern and a fourth pattern adjacent to the third pattern, of the plurality of patterns of the first diffraction grating is wider than an interval between adjacent patterns of remaining patterns of the plurality of patterns of the first diffraction grating.

31. The method according to claim 30, wherein a fourth interval between a fifth pattern as a pattern at an end portion and a sixth pattern adjacent to the fifth pattern, each of the fourth interval and a fifth interval between the sixth pattern and a seventh pattern adjacent to the sixth pattern, or each of the fourth interval, the fifth interval and a sixth interval between the seventh pattern and a eighth pattern adjacent to the seventh pattern, of the plurality of patterns of the second diffraction grating is wider than an interval between adjacent patterns of remaining patterns of the plurality of patterns of the second diffraction grating.

32. The method according to claim 30, wherein each of intervals of the remaining patterns of the plurality of patterns of the first diffraction grating is the same.

33. The method according to claim 30, wherein the third interval of the first diffraction grating is wider than intervals between adjacent patterns of the remaining patterns of the first diffraction grating, the second interval is wider than the third interval, and the first interval is wider than the second interval.

34. The method according to claim 31, wherein the fifth interval of the second diffraction grating is wider than intervals between adjacent patterns of the remaining pattern of the second diffraction grating, the fifth interval is wider than the sixth interval, and the fourth interval is wider than the fifth interval.

* * * * *